(12) United States Patent
Kitabatake et al.

(10) Patent No.: US 6,995,473 B2
(45) Date of Patent: Feb. 7, 2006

(54) STACKED SEMICONDUCTOR TRANSISTORS

(75) Inventors: Makoto Kitabatake, Nara (JP);
Kazuhiko Asada, Osaka (JP);
Hidekazu Yamashita, Osaka (JP);
Nobuyoshi Nagagata, Kyoto (JP);
Kazuhiro Nobori, Osaka (JP); Hideki Omori, Hyogo (JP); Masanori Ogawa, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 130 days.

(21) Appl. No.: 10/736,672

(22) Filed: Dec. 17, 2003

(65) Prior Publication Data

US 2004/0124474 A1    Jul. 1, 2004

(30) Foreign Application Priority Data

Dec. 19, 2002   (JP) ............................. 2002-367848

(51) Int. Cl.
*H01L 23/48*   (2006.01)

(52) U.S. Cl. ........................................ 257/777; 257/686
(58) Field of Classification Search ............... 257/686, 257/777–778
See application file for complete search history.

(56) References Cited

U.S. PATENT DOCUMENTS 5,793,115 A  *  8/1998  Zavracky et al. ........... 257/777
6,150,724 A  *  11/2000  Wenzel et al. ............. 257/777
2001/0055838 A1 *  12/2001  Walker et al. ............. 438/129

FOREIGN PATENT DOCUMENTS

JP              59107554 A  *  6/1984

* cited by examiner

*Primary Examiner*—Allan R. Wilson
(74) *Attorney, Agent, or Firm*—McDermott Will & Emery LLP

(57) ABSTRACT

At least two switching devices each including a substrate formed of a wide bandgap semiconductor, source and gate electrodes formed in a principal surface side of the substrate, and a drain electrode formed on the back surface of the substrate are stacked so that respective upper surface sides of the switching face each other.

6 Claims, 6 Drawing Sheets

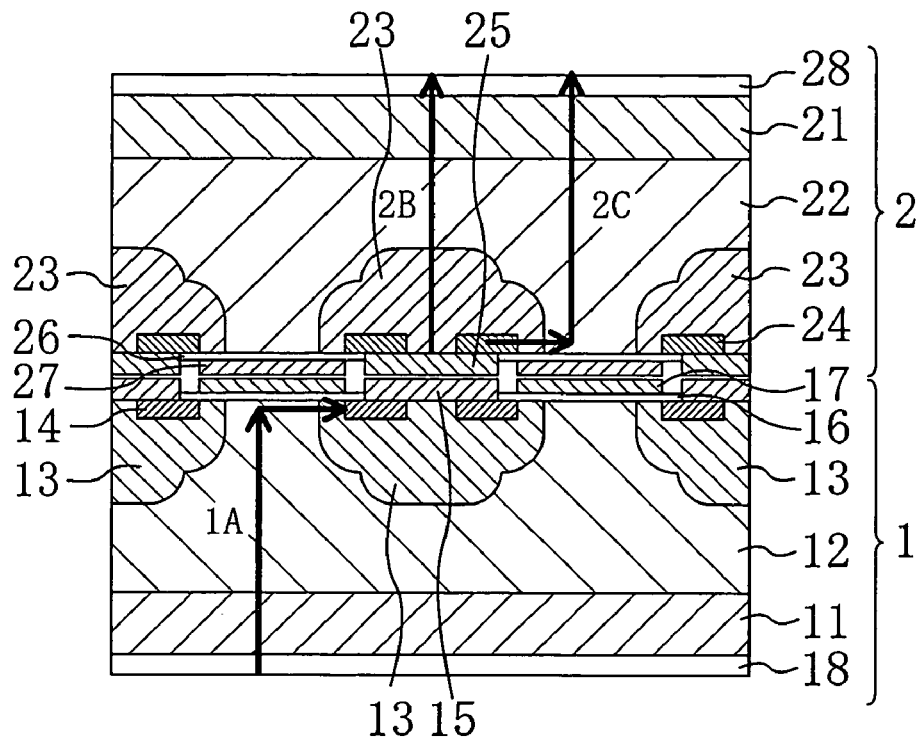
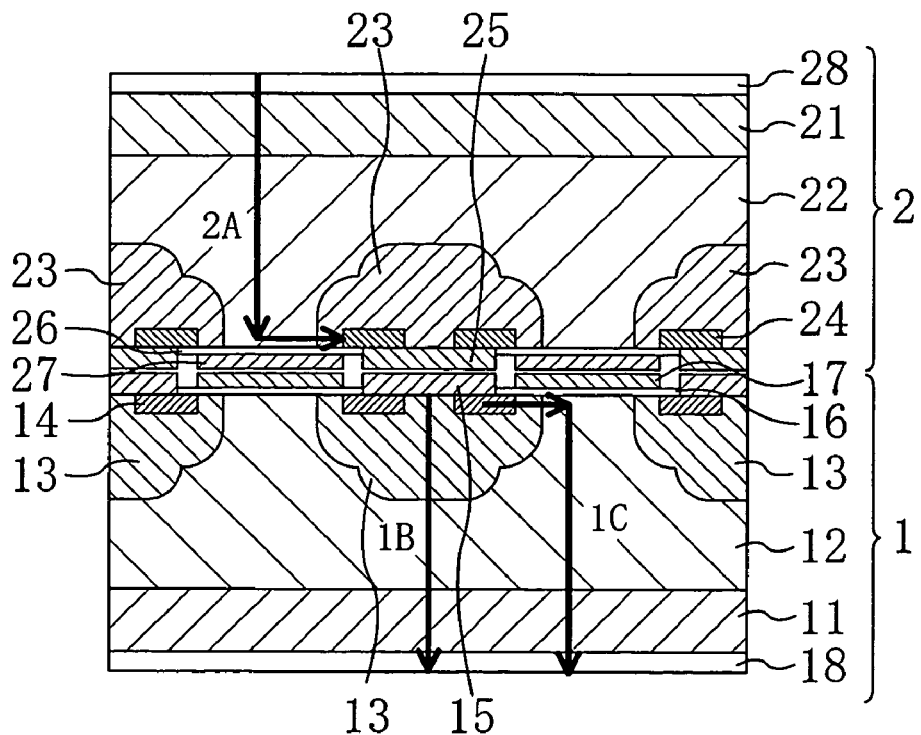

STACKED SEMICONDUCTOR TRANSISTORS

BACKGROUND OF THE INVENTION

The present invention relates to semiconductor power device, and more particularly relates to a semiconductor device which is formed of a wide bandgap semiconductor and in which a bi-directional switching operation can be performed and a sustaining circuit using the semiconductor device.

Semiconductor power devices are used in power electronic applications in which high voltage is applied and used for high current power switches of electronic instruments.

A known semiconductor power device such as a diode, a vertical-type MOSFET or the like has a pn juction. In this structure, current does not flow due to a depletion layer formed when a reverse bias is applied to the pn junction, so that the semiconductor device becomes resistant to high voltage. Because of this, when the known power device is operated as a switching device, it is necessary to convert an alternating voltage supplied from a power supply to a direct voltage so that the polarization of a voltage applied to the power device is kept constant.

As an example of such switching devices, a known vertical-type MOSFET will be described.

FIG. 6 is a cross-sectional view illustrating a general vertical-type MOSFET as an example of switching device. As shown in FIG. 6, the known vertical-type MOSFET includes an n-type Si (silicon) substrate 193, an n-type doped layer 192 formed on the principal surface of the Si substrate 193, a p-type well 195 formed so as to be surrounded by the n-type doped layer 192, an n-type source 196 formed so as to be surrounded by the p-type well 195, a gate insulation film 199 formed on a surface of the p-type well 195 having part sandwiched by the n-type doped layer 192 and the n-type source 196, a gate electrode 200 formed on the gate insulation film 199, a source electrode 197 formed on the n-type source 196, and a drain electrode 198 formed on the back surface of the Si substrate 193. In this structure, if the thickness of the Si substrate 193 is about 300 $\mu$m and the thickness of a silicon layer in which the n-type doped layer 192, the p-type well 195 and the n-type source 196 are formed is about 100 $\mu$m, a breakdown voltage of 1 kV can be ensured.

In the vertical-type MOSFET, electrons serve as carriers and a pn junction is formed between the n-type doped layer 192 and the p-type well 195. To operate the vertical-type MOSFET, a positive voltage is applied to the drain electrode 198 and the source electrode 197 is set at a ground potential. In this state, a positive voltage is applied to the gate electrode 200 to make a current flow through a channel, so that electrons flow from the n-type source 196 into a drain side. In this manner, the vertical-type MOSFET is turned ON. That is to say, by changing a gate voltage, ON and OFF of a current can be controlled. The vertical-type MOSFET allows precise control of electric instruments by an inverter or the like to contribute to reduction in power consumption. Note that switching devices include not only vertical-type MOSFETs but also IGBTs (insulated gate bipolar transistors) and the like.

SUMMARY OF THE INVENTION

As described above, when a general switching device is used, it is necessary to apply a voltage having a predetermined polarity to the switching device. Therefore, an alternating current has to be converted to a direct current first. This AC-DC conversion is normally carried out by a bridge circuit using a diode and an AC-DC conversion circuit including a large capacity capacitor. However, when AC-DC conversion is performed by the AC-DC conversion circuit, a current flows in the diode, thus resulting in conduction loss. Furthermore, a large capacity is required if a large capacity capacitor is provided. Therefore, for the known switching device, there is a limitation in view of energy consumption resulting from reduction in a circuit size and loss.

It is therefore an object of the present invention to provide a switching device with a reduced area size and suppressed power loss.

A semiconductor device according to the present invention includes: a first transistor including a first substrate formed of a wide bandgap semiconductor and containing an impurity of a first conductive type, a first electrode formed in a principal surface side of the first substrate, a second electrode formed in a back surface side of the first substrate and a first control electrode formed in the principal surface side of the first substrate; and a second transistor formed of a wide bandgap semiconductor, including a second substrate containing an impurity of a first conductive type, a third electrode formed in a principal surface side of the second substrate and electrically connected to the first electrode, a fourth electrode formed in a back surface side of the second substrate, and a second control electrode formed in the principal side of the second substrate, and having the same electric properties as those of the first transistor. In the semiconductor device, the first transistor and the second transistor are stacked so that the respective principal surface sides of the first substrate and the second substrate face each other.

With this structure, for example, if each of the first and second transistors is a transistor in which a current flows in the vertical direction, a switching operation can be performed even though the polarity of a voltage applied between the second and fourth electrodes is changed. Thus, the semiconductor device can be driven by an alternating current. Moreover, two transistors are stacked, so that a circuit area can be reduced to about ½, compared to the case where two transistors are arranged side by side on the same substrate. Furthermore, the substrate formed of a wide bandgap semiconductor is used, so that a current density can be increased, compared to the case where a known Si substrate is used. Thus, a device size can be largely reduced.

If the inventive semiconductor is a semiconductor which is operable as a bi-directional device and in which the first control electrode and the second control electrode are electrodes for controlling a current flowing from the second electrode to the fourth electrode or a current flowing from the fourth electrode to the second electrode, a switching operation can be performed even though the polarities of voltages applied between the second electrode and the fourth electrode are changed. Thus, the device can be driven by an alternating current. Accordingly, with the semiconductor device according to the present invention, AC-DC conversion is not necessarily performed and a switching operation at a high voltage can be performed in a smaller area. Therefore, the semiconductor of the present invention is preferably used for a sustaining circuit of a plasma display or the like.

If each of the first transistor and the second transistor is a vertical-type MISFET, each of the first electrode and the third electrode is a source electrode, each of the second electrode and the fourth electrode is a drain electrode, and each of the first control electrode and the second control electrode is a gate electrode, a bi-directional device with small loss can be achieved.

If each of the first substrate and the second substrate is formed of silicon carbide, increase in the temperature of the inventive device can be effectively suppressed, compared to the case where a silicon substrate is used, because silicon carbide has excellent heat dissipation properties. Moreover, the current density of silicon carbide is about 10 times larger than that of silicon. Thus, with a current at the same level, a planar size of the semiconductor device of the present invention can be reduced to about 1/10 of a known semiconductor device in which two transistors are stacked. Accordingly, the size of the semiconductor device of the present invention can be reduced to about 1/20 of that of a known semiconductor device in which tow transistors are arranged in the lateral direction. Moreover, a relatively small semiconductor can be fabricated in a simple manner, compared to the case where some other wide bandgap semiconductor is used.

If the inventive semiconductor device further includes: a first conductive plate interposed between the first transistor and second transistor, having protruding part, and connected to the first electrode and the third electrode; and a second conductive plate interposed between the first transistor and second transistor, having protruding part, connected to the first control electrode and the second control electrode, and electrically isolated from the first conductive plate, each of the protruding parts of the first and second conductive plates can be used as a lead terminal for applying a control voltage between the first and second control electrodes and the first and third electrodes.

If the inventive semiconductor device further includes: a first metal plate adhered to the back surface of the first substrate; and a second metal plate adhered to the back surface of the second substrate, packaging can be performed to a circuit substrate in a simple manner and, furthermore, heat dissipation properties can be improved.

A sustaining circuit according to the present invention is a sustaining circuit including a bi-directional device which is connectable to a plasma display panel and includes an output section for outputting a pulse voltage for driving the panel and connected to the output section and in which the bi-directional device includes: a first transistor including a first substrate formed of a wide bandgap semiconductor and containing an impurity of a first conductive type, a first electrode formed in a principal surface side of the first substrate, a second electrode formed in a back surface side of the first substrate and a first control electrode formed in the principal surface side of the first substrate; and a second transistor formed of a wide bandgap semiconductor, including a second substrate containing an impurity of a first conductive type, a third electrode formed in a principal surface side of the second substrate and electrically connected to the first electrode, a fourth electrode formed in a back surface side of the second substrate, and a second control electrode formed in the principal side of the second substrate, and having the same electric properties as those of the first transistor, and the first transistor and the second transistor are stacked so that the respective principal surface sides of the first substrate and the second substrate face each other.

With this structure, the area of the sustaining circuit can be reduced and simplified, compared to the case where a large number of known transistors formed of Si are arranged. Moreover, since a wide bandgap semiconductor has low loss and excellent heat resistance, an equipment for cooling the device can be omitted. As a result of use of the sustaining circuit of the present invention, the structure of a driver circuit for a PDP can be simplified.

If the inventive sustaining circuit further includes: a capacitor having a terminal grounded and another terminal connected to the bi-directional device; an inductance provided between the bi-directional device and the output section; a first switch provided between a first power supply and the output section; and a second switch provided between a second power supply for supplying a lower voltage than that of the first power supply and the output section, it is possible to make currents flow in a bi-directional device in different directions in the case where a voltage of the output section is higher than that of the capacitor and in the case where the voltage of the output section is lower than that of the capacitor.

It is preferable that each of the first transistor and the second transistor is a vertical-type MISFET, each of the first electrode and the third electrode is a source electrode, each of the second electrode and the fourth electrode is a drain electrode, and each of the first control electrode and second control electrode is a gate electrode.

BRIEF DESCRIPTION OF THE DRAWINGS

FIGS. 1A and 1B are cross-sectional views schematically illustrating a bi-directional device according to a first embodiment of the present invention.

DESCRIPTION OF THE PREFERRED EMBODIMENTS

Examination of Device Structure

As described above, it is because the area of an AC/DC converter circuit is large that a known switching device has a large circuit area. Then, the present inventors thought of forming a switching device having a structure which is operable with an alternating current.

To operate a switching device by an alternating current, a method in which two switching devices having the same structure are connected to each other and arranged side by side in a plane so as to function as bi-direactional devices seems to be possibly used.

Figure 6:
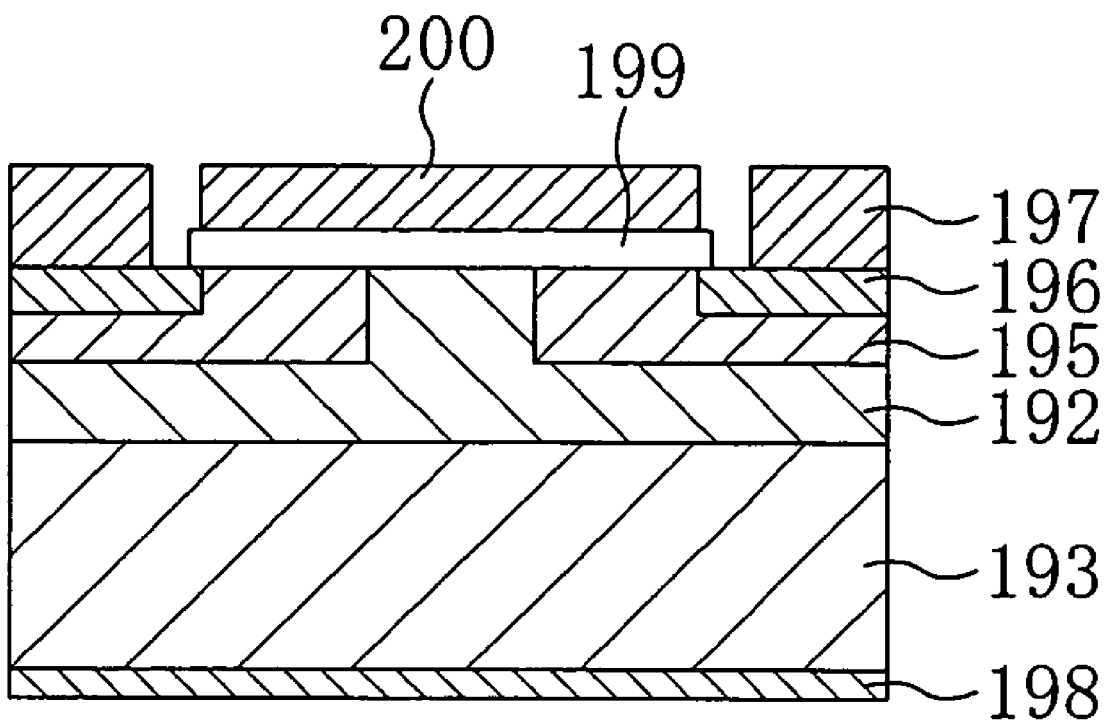
FIG. 6 is a cross-sectional view illustrating a general vertical-type MOSFET as an example of switching device.
Figure 7:
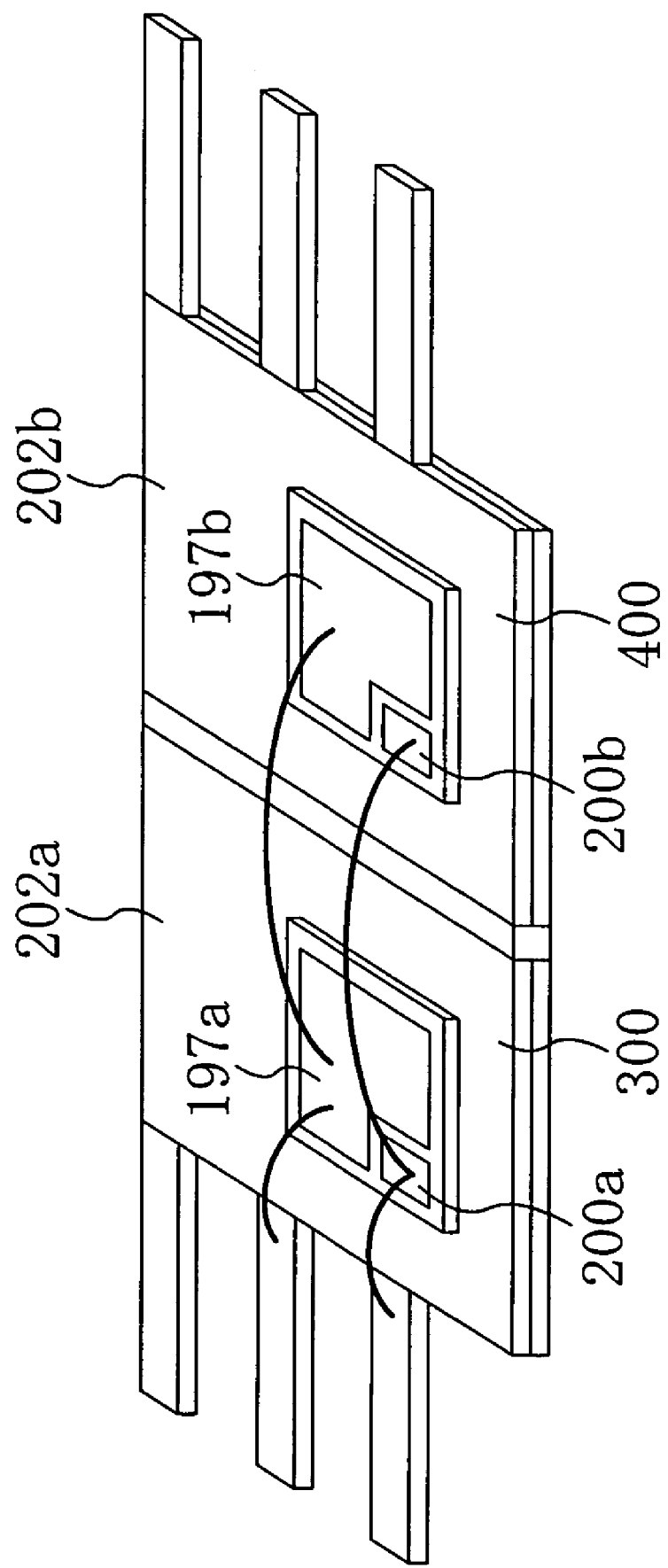
FIG. 7 is a perspective view illustrating a bi-dierctional device formed by arranging two known vertical-type MOSFETs in the lateral direction.

FIG. 7 is a perspective view illustrating a bi-dierctional device obtained by arranging two known vertical-type MOSFETs in the lateral direction. FIG. 7 illustrates an example in which first and second MOSFETs 300 and 400 each having the same structure as that of the vertical-type MOSFET of FIG. 6 are arranged in a plane so as to be adjacent to each other. In the bi-directional device, a source electrode 197a of the first MOSFET 300 and a source electrode 197b of the second MOSFET 400 are connected to each other by a wire, a gate electrode 200a of the first MOSFET 300 and a gate electrode 200b of the second MOSFET 400 are connected to each other by a wire. Moreover, a first conductive plate 202a connected to a drain electrode of the first MOSFET 300 is provided under the first MOSFET 300 and a second conductive plate 202b connected to a drain electrode of the second MOSFET 400 is provided under the second MOSFET 400. With this structure, even if the polarities of voltages applied to the source electrodes 197a and 197b, respectively, are reversed, an operation can be normally performed. Thus, the switching device can be driven with an alternating current.

However, in such a bi-directional device, although an AC/DC converter circuit is not necessary, the area of the switching device itself is increased. Specifically, in the case of a power device using a high current, an area is markedly increased. Then, the present inventors conducted further research to reach a method in which two switching devices in the same structure are stacked so that the respective principal surfaces of the switching devices face to each other. If a bi-directional device is formed by stacking two switching devices, the size of the bi-directional device, which have been packaged, can be about ½ of that of the bi-directional device of FIG. 7.

In this case, however, the evolution of heat during an operation time becomes a problem in the known switching device formed of Si. Therefore, the present inventors also conducted examination of suitable materials. As a result, it has been found that it is preferable to use a highly resistant wide bandgap semiconductor because the thickness of the device can be reduced. In this case, a wide bandgap semiconductor means to be a semiconductor having a wider bandgap than that of Si, such as silicon carbide (SiC), diamond, gallium nitride (GaN), zinc oxide (ZnO) and the like. Moreover, it has been found that if a highly thermally conductive material such as SiC and diamond, among the above-described wide bandgap semiconductors, is used as a material, a bi-directional device in which heat increase is further suppressed can be obtained. Then, it seems practical and the most preferable to use SiC among those with excellent thermal conductivity as a material.

Moreover, the current density of SiC can be increased to a level ten times as high as that of Si. Therefore, with the same current level, if SiC is use, the planar size of a semiconductor device can be reduced to about ⅒ of a known semiconductor device.

Hereinafter, embodiments of the present invention will be described.

(First Embodiment)

FIGS. 1A and 1B are cross-sectional views illustrating bi-directional device according to a first embodiment of the present invention.

As shown in FIGS. 1A and 1B, the bi-directional device of the present invention includes a first switching device 1, a second switching device 2 formed on the first switching device 1 so that a principal surface side thereof faces a principal surface side of the second switching device 2. In this example, the first and second switching devices 1 and 2 are vertical-type MOSFETs each having the same electric properties. Note that in this application, a principal surface side of a switching device corresponds to a principal surface side of a substrate.

As shown in FIGS. 1A and 1B, the first switching device 1 includes a substrate 11 formed of an n-type SiC, an n-type doped layer (drain layer) 12 epitaxially grown over the principal surface of the substrate 11, formed of nitrogen-containing SiC, and having a thickness of 10 $\mu$m, a p-type well 13 formed so as to be surrounded by the n-type doped layer 12 and containing Al, an n-type source 14 formed so as to be surrounded by the p-type well 13 and containing nitrogen, a gate insulation film 16 formed so as to be located on at least two p-type wells 13, a gate electrode 17 formed on the gate insulation film 16 and formed of Al, a source electrode 15 formed on the n-type source 14 and formed of Ni, and a drain electrode 18 formed on the back surface of the substrate 11 and formed of Ni. In this embodiment, the thickness of the drain layer can be suppressed to be about ⅒ of a switching device formed of Si.

Moreover, the second switching device 2 includes a substrate 21 formed of n-type SiC, a doped layer (drain layer) 22 epitaxially grown on the principal surface of the substrate 21, formed of nitrogen containing SiC, and having a thickness of 10 $\mu$m, a p-type well 23 formed so as to be surrounded by the n-type doped layer 22, an n-type source 24 formed so as to be surrounded by the p-type well 23 and containing nitrogen, a gate insulation film 26 formed on two of the p-type wells 23 and formed of $SiO_2$, a gate electrode 27 formed on the gate insulation film 26 and formed of Al, a source electrode 25 formed on the n-type source 24 and formed of Ni, and a drain electrode 28 formed on the back surface of the substrate 21 and formed of Ni. Moreover, in FIG. 1, an adjacent vertical-type MOSFET is also shown and a plurality of vertical-type MOSFETs are formed on one chip.

Moreover, the respective carrier concentrations of the n-type doped layers 12 and 22 are $2 \times 10^{17}$ $cm^{-3}$, the respective carrier concentrations of the p-type wells 13 and 23 are $1 \times 10^{16}$ $cm^{-1}$ and the respective carrier concentrations of the n-type source 14 and 24 are $1 \times 10^{18}$ $cm^{-3}$.

Note that in FIGS. 1A and 1B, although the respective gate electrodes of the first and second switching devices 1 and 2 seem to be directly connected to each other and also the respective source electrode of the first and second switching devices 1 and 2 are directly connected to each other, an interlevel insulation film is provided between the first and second switching devices 1 and 2. Therefore, the gate electrode and source electrode of the first and second switching device 1 are electrically connected to the gate electrode and source electrode of the second switching device 2, respectively, with a plug, a conductive plate or the like interposed therebetween.

The bi-directional device can be fabricated using a combination of known methods.

That is to say, a substrate 11 is prepared, and then an n-type doped layer 12 is epitaxially grown on the principal surface of the substrate 11 by a known method. Subsequently, aluminum ions are implanted into an n-type doped layer 12 and activation annealing is performed, so that a p-type well 13 is formed. Thereafter, nitrogen ions are implanted into the p-type well 13 and activation annealing is performed, so that an n-type source 14 is formed. Then, the substrate 11 is thermally oxidized to form a gate insulation film 16. Next, after Ni has been deposited on the upper surface of the n-type source 14 and the back surface of the substrate 11 by evaporation, the substrate 11 is heated, thereby forming a source electrode 15, which is an ohmic electrode, on the n-type source 14 and the p-type well 13 and a drain electrode 18, which is an ohmic electrode, on the back surface of the substrate 11. Then, Al is deposited on the gate insulation film 16 by evaporation to form a gate electrode 17. In this manner, the first switching device 1 is formed.

Next, a wafer on which the first switching device 1 has been formed is diced, thereby fabricating a chip on which the first switching device 1 is provided. In the same manner, a chip on which the second switching device 2 is provided is fabricated.

Subsequently, the second switching device 2 and the first switching device 1 are bonded to each other so that the respective principal surfaces of the second switching device 2 and the first switching device 1 face each other. Note that before bonding the two switching devices, an interlevel insulation film, a plug passing through the interlevel insulation film or the like is formed on the first switching device as necessary. Moreover, an electrode plate to be an external terminal may be formed so as to be interposed between the first and second switching devices as necessary. In the above-described manner, the bi-directional device of this embodiment can be fabricated.

In the bi-directional device of this embodiment, by applying a control voltage between a source electrode and a gate electrode, a current flowing from the drain electrode 18 of the first switching device 1 to the drain electrode 28 of the second switching device 2 can be controlled. Moreover, when the polarities of voltages applied to the drain electrode 18 and the drain electrode 28, respectively, are reversed, a current in the reverse direction flows. Such an operation of the bi-directional device of the present invention will be described with reference to FIG. 1.

First, as shown in FIG. 1A, when a positive voltage is applied to the drain electrode 18 of the first switching device 1 and a negative voltage is applied to the drain electrode 28 of the second switching device 2, at the pn junction between the p-type well 23 and the doped layer 22, a positive voltage is applied to the p side of the pn junction and a negative voltage is applied to the n side of the pn junction, so that a current 2B flows from the source electrode 25 to the drain electrode 28. That is to say, the pn junction is turned ON.

On the other hand, at the pn junction between the p-type well 13 and the n-type doped layer 12, the direction of a voltage applied is reversed, so that the pn junction is turned OFF. Thus, a current does not flow. Accordingly, a current does not flow between the drain electrode 18 and the drain electrode 28, and most of the voltage which has been applied thereto is applied to a depletion layer formed in a pn junction portion of the first switching device 1.

Then, in this state, when an electric filed which makes the gate electrode 17 positive is applied between the source electrode 15 and the gate electrode 17, an operation of the first switching device as an MOSFET becomes ON, so that a current 1A flows via the drain electrode 18, the substrate 11, the n-type doped layer 12, the p-type well 13, the n-type source 14 and the source electrode 15. Since the second switching device 2 is already in a state in which the current 2B flows, a current path through which 1A flows is connected to a current path through which 2B flows in the bi-directional device of this embodiment. In this case, if a voltage between the source electrode 15 and the gate electrode 17 is increased, the current 1A is increased. Note that in the bi-directional device of this embodiment, the gate electrode 17 and the gate electrode 27 are electrically connected to each other and thus have the same potential and the source electrode 15 and the source electrode 25 are also electrically connected to each other and thus have the same potential. Therefore, the second switching device 2 is operated as an MOSFET as in the same manner as the first switching device 1, so that a current 2C flows. That is to say, by applying a voltage which is positive with respect to the source electrode and equal to or higher than the threshold voltage of the first and second switching devices to the gate electrode, a current flows from the drain electrode 18 to the drain electrode 28 when a positive voltage is applied to the drain electrode 18 and the drain electrode 28. In this case, due to the flow of the current 2C, a voltage drop caused when the current 2B flows becomes smaller. Thus, conduction loss can be reduced, compared to that of a device in which a current flows only at the pn junction.

In contrast, assume that a negative voltage is applied to the drain electrode 18 of the first switching device 1 and a positive voltage is applied to the drain electrode 28 of the second switching device 2. As shown in FIG. 1B, unless a potential difference is not generated between the gate electrode and the source electrode, most of the voltage which has been applied between the drain electrodes is applied to a depletion layer formed in a pn junction portion of the first switching device 2. In this case, the pn junction between the p-type well 13 and the n-type doped layer 12 is turned ON, so that only a current 1B flows from the source electrode 15 and the n-type doped layer 18. Then, when with a voltage applied to each of the drain electrodes sustained, a voltage equal to or higher than a threshold voltage is applied to the gate electrodes 17 and 27, an operation of the second switching device 2 as an MOSFET becomes ON, so that a current 2A flows from the drain electrode 28 to the source electrode 25 via the n-type doped layer 22, the p-type well 23, and the n-type source 24. At the same time, the first switching device 1 becomes ON, so that a current 1C flows from the source electrode 15 and the drain electrode 18.

In this manner, even if the polarity of a voltage applied to a drain electrode is changed, the bi-directional device of this embodiment can be operated with small voltage loss. Moreover, in the bi-directional device of this embodiment, the first and second switching devices 1 and 2 have the same electric properties. Thus, even if the polarity of a voltage applied is changed, a switching operation can be performed according to the absolute value of a voltage applied. Therefore, the bi-directional device of this embodiment can be AC driven. Accordingly, with the bi-directional device of this embodiment, an AC/DC converter circuit is not necessary, so that the area of an entire circuit can be reduced. Moreover, since the two switching devices are stacked, an area in a packaged state can be reduced to be about ½ of that in the case where two switching devices are provided on the same substrate so as to be located adjacent to each other. Moreover, for example, it has been normally necessary to ensure a size of 5 mm square when a switching device using an about 20 A (ampere) pulse current is formed of Si. However, when a switching device is formed of SiC, a planar area can be suppressed to be about ¹⁄₁₀ of that of the known device. Accordingly, with the bi-directional device of this embodiment, an area can be suppressed to be about ¹⁄₂₀ of that of the bi-directional device of FIG. 7. Furthermore, as will be described later, since SiC has better thermal conductivity than that of Si, an increased in temperature resulting from an operation can be suppressed when a pulse current is used. Thus, the size of the bi-directional device can be further reduced. Therefore, the bi-directional device of this embodiment can be preferably used for a sustaining circuit of a plasma display panel (PDP) or the like.

Note that the reason why the bi-directional device of this embodiment can have a layered structure of two switching devices is that a substrate and a deposited layer on the substrate are formed of SiC. When as power electronic application device, a high voltage switching device using a voltage of several kV or more is formed of Si, it has been necessary to make a thickness of the device about several hundred μm so that the device has resistance. In contrast, SiC is a wide bandgap semiconductor and, therefore, when SiC is used as a material for forming a device, the thickness of the device can be largely reduced. For a reference, a necessary thickness of an epitaxially grown layer (drift layer) for achieving an MOSFET which is resistant to a voltage of 1 kV or more is 100 μm in the case of a Si layer. In contrast, it is 10 μm in the case of a SiC layer. That is to say, the thickness of the switching device constituting the bi-directional device of this embodiment is smaller than that of the known device, and thus heat dissipation can be improved and conduction loss can be reduced. Furthermore, SiC has a thermal conductivity three times as high as that of Si. Thus, the switching device of this embodiment has better heat dissipation. Moreover, heat resistance of SiC is very high, compared to Si. For these reasons, when a high current flows with a high voltage, the temperature of the bi-directional device of this embodiment can be suppressed within an operable temperature. Therefore, the bi-directional device of this embodiment can be used for a power electronic circuit such as an inverter.

Note that with some other wide bandgap semiconductor than SiC, such as diamond and gallium nitride (GaN), the thickness of a device can be reduced. Therefore, such wide bandgap semiconductors can be used as a material for forming a device. The thermal conductivity of diamond is three times as high as that of Si. Thus, it is specifically preferable to use diamond as a substitute of SiC. However, in the current technology, a smaller size device can be fabricated when SiC is used.

The case where a switching device is a vertical-type n-channel MOSFET has been described so far. However, even if a p-channel vertical-type MOSFET is used, a bi-directional device can be fabricated. In that case, the direction in which a current flows when a voltage is applied between drains of two switching devices is reversed from that in the case of the n-channel type. Moreover, a negative voltage with respect to a source electrode or a voltage equal to or lower than a threshold voltage is applied to a gate electrode, a current flows between the drains.

Moreover, if a large number of vertical-type MOSFETs as unit devices are continuously arranged in the bi-directional device, the bi-directional device can be operated. Moreover, an isolation insulation film may be formed between adjacent devices.

Note that in the bi-directional device of this embodiment, the switching device is a vertical-type MOSFET. However, instead of this, an IGBT or a bipolar transistor may be used. A bipolar transistor which has the same structure as that shown in FIGS. 1A and 1B but does not includes a gate insulation film may be used. Moreover, a GTO thyristers stack can be function as a bi-directional device.

Terminal Structure of Bi-Directional Device

Figure 2A:
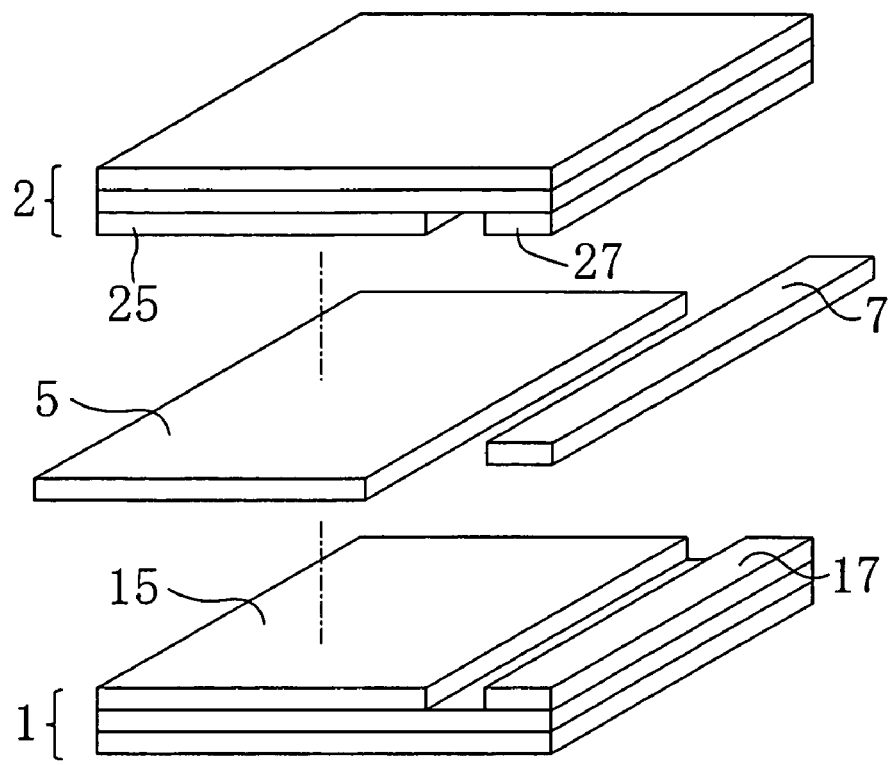
FIGS. 2A and 2B are a schematic view illustrating a three-dimensional electrode structure of the bi-directional device of the first embodiment and a planar view illustrating an example of the bi-directional device, respectively.
Figure 2B:
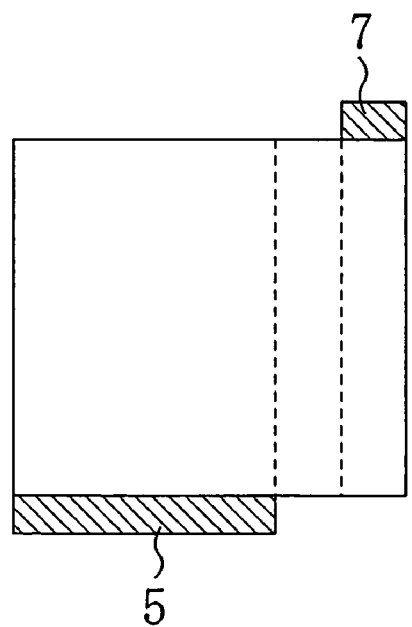

FIG. 2A is a schematic view illustrating the three-dimensional structure of an electrode of the bi-directional device of this embodiment. FIG. 2B is a plane view illustrating an example of the bi-directional device of this embodiment. Note that in FIG. 2A, an interlevel insulation film, a plug and the like are not shown.

As shown in FIG. 2A, a first metal plate 5 electrically connected to the source electrode 15 and the source electrode 25 and a second metal plate 7 electrically connected to the gate electrode 17 and the gate electrode 27 are interposed between the switching device 1 and the switching device 2. Then, as shown in FIG. 2B, each of the first and second metal plates 5 and 7 each having a thickness of about 50 μm has part protruding out from the substrate of the switching device, when viewed from the top. Having the protruding parts, the first metal plate 5 and the second metal plate 7 function as a lead terminal for a source electrode and a lead terminal for a gate electrode, respectively.

To operate the bi-directional device of the present invention, it is necessary to apply a control voltage between the source electrode 15 and the gate electrode 17 and between the source electrode 25 and the gate electrode 27. Therefore, a lead terminal to be connected to the outside is needed. In this embodiment, a structure in which the first and second metal plates 5 and 7 are interposed between the switching devices 1 and 2 is used, so that a lead terminal can be formed in a simple manner. In addition, heat generated in each switching device can be effectively dissipated. Thus, increase in the temperature of the bi-directional device can be suppressed. The heat dissipation effect can be further increased by reducing the thicknesses of the first and second metal plates 5 and 7. Materials for the first and second metal plates 5 and 7 are not particularly limited as long as they are Ni, Al, Mo, Au and other metals.

Note that in the bi-directional device of this embodiment, a control voltage has to be a floating voltage insulated with respect to an alternating voltage applied to the drain electrodes 18 and 28. Moreover, an electrical conductive state is not formed between the first and second metal electrodes 5 and 7.

Note that in the example of FIGS. 2A and 2B, the protruding part of the first metal electrode 5 and the protruding part of the second metal electrode 7 are located in different sides of the bi-directional device. However, the protruding part of the first metal electrode 5 and the protruding part of the second metal electrode 7 may be provided in the same side or in adjacent sides, respectively, when viewed from the top.

Note that a lead terminal can be formed by some other method than a method using a metal plate.

Next, a structure example of the drain electrode side which is suitable for packaging will be described.

Figure 3:
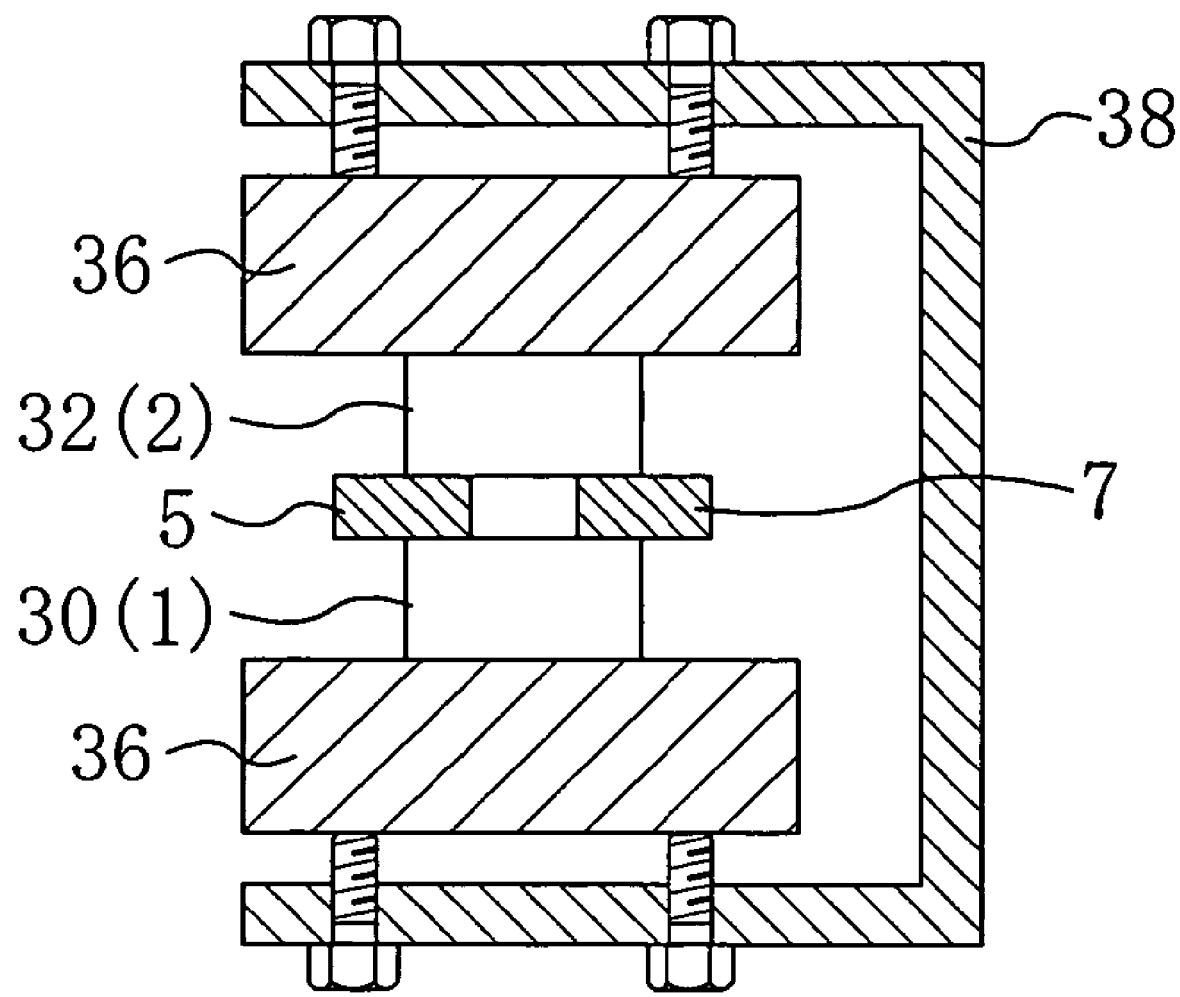
FIG. 3 is a cross-sectional view illustrating an exemplary structure of the bi-directional device of the first embodiment which is suitable for packaging.

FIG. 3 is a cross-sectional view illustrating an exemplary structure of the bi-directional device of this embodiment which is suitable for packaging. As shown in FIG. 3, a conductive plate 36 formed of a conductive material such as gold (Au) or the like may be adhered to each of the drain electrode (back surface) of a first semiconductor chip 30 in which the first switching device 1 is provided and the drain electrode (back surface) of a second semiconductor chip 32 in which the second switching device 2 is provided. In this case, packaging can be preferably carried out in a simple manner. Moreover, by providing the conductive plate 36, heat dissipation properties of the bi-directional device can be improved. Heat dissipation properties of the bi-directional device can be improved by increasing in the thickness of the conductive plate 36 to increase heat capacity.

When the conductive plate 36 is adhered to the bi-directional device, for example, the conductive plate 36 is fixed by a fixing instrument 38 shown in FIG. 3 and then heated. Thereafter, resin sealing or some other process steps may be performed as necessary, or the conductive plate 36 may be directly fixed on a circuit board by a solder. Note that it is also possible to seal with resin the bi-directional device, with the fixing instrument 38 attached thereto. Moreover, it is also possible to perform supersonic fusion or some other process step with no heat applied, while the bi-directional device is being fixed by the fixing instrument 38. Assume that gold is used as a material of the conductive plate 36. If a sufficient surface treatment has been performed to the conductive plate 36, it is also possible to adhere the conductive plate 36 to a drain electrode only by bringing the conductive plate 36 into contact with the drain electrode.

(Second Embodiment)

As a second embodiment of the present invention, a sustaining circuit using the bi-directional device described in the first embodiment will be described. The sustaining circuit is part of a driver circuit for a PDP.

Figure 4:
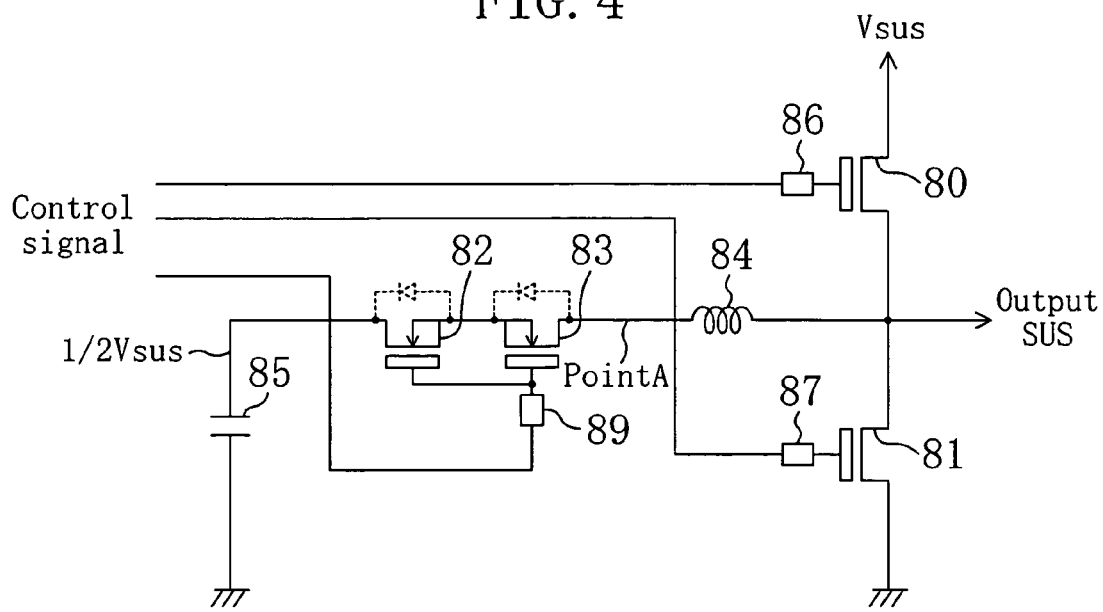
FIG. 4 is a circuit diagram of a sustaining circuit according to a second embodiment of the present invention.
Figure 5:
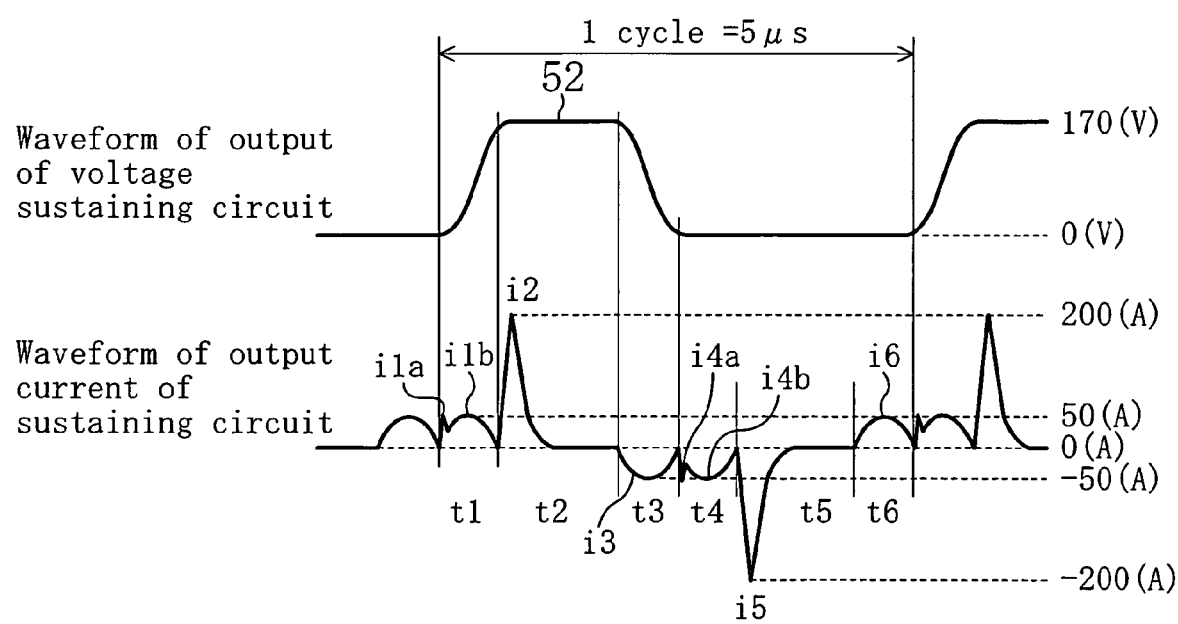
FIG. 5 is a waveform chart illustrating the waveform of an output current and the waveform of an output voltage of the sustaining circuit of FIG. 4.

FIG. 4 is a circuit diagram of a sustaining circuit according to the second embodiment. FIG. 5 is a waveform chart illustrating the waveform of an output current and the waveform of an output voltage of the sustaining circuit of FIG. 4.

The sustaining circuit of the PDP is a driver circuit for supplying a sustaining pulse voltage to an electrode of the PDP to emit light for display. As shown in FIG. 5, the sustaining circuit of this embodiment includes an output section for outputting a driving voltage of the PDP, first and second switching devices 82 and 83 each of which is an n-channel vertical-type MOSFET, an inductance 84, a capacitor 85, a third switching device 81 which is an n-channel vertical-type MOSFET, a fourth switching device 80, a first gate driving circuit 89 for controlling an operation of the first and second switching devices 82 and 83, a second gate driving circuit 87 for controlling an operation of the third switching device 81, and a third gate driving circuit 86 for controlling an operation of the fourth switching device 80. Respective sources of the first and second switching devices 82 and 83 are connected to each other and respective gate electrodes of the first and second switching devices 82 and 83 are connected to each other. The inductance 84 has a terminal connected to the drain of the second switching device 83 and another terminal connected to the output section. The capacitor 85 is connected to the drain of the first switching device 82. The third switching device 81 has a termianl grounded. The first and second switching devices 82 and 83 are the bi-directional devices described in the first embodiment. Moreover, an interconnect connecting the third switching device 81 and the fourth switching device 80 is connected to an interconnect connecting the inductance 84 and an output section. Note that although not shown in FIG. 4, in the driver circuit, the output section of the sustaining circuit is connected to a terminal of a capacitor located in a panel side.

Next, the operation of the sustaining circuit of this embodiment will be described with reference to FIG. 5.

First, when an output voltage of a sustaining circuit in a counterpart side falls from slightly higher voltage than 0 V to 0 V, an output current i1a flows into a body diode of the third switching device 81 at t1. Note that the "counterpart side" means to be a side of a panel side capacitor in which the sustaining circuit of this embodiment is not located.

Then, at t1, if the first switching device 82 is turned ON simultaneously to a start of an output current i1a flow, a voltage of Vsus/2 (V) of the capacitor 85 is supplied to a point A via the first and second switching devices 82 and 83. Thus, the voltage at the point A is pulled up, so that capacitor components of the inductance 84 and a scan electrode start oscillating. Subsequently, an output voltage of the sustaining circuit rises from 0 (V) to slightly lower voltage than Vsus (V). At this time, the output current i1b flows in the first and the second switching devices 82 and 83. Then, because the output currents i1a and i1b flow therein, power loss due to ON resistances of the first and second switching devices 82 and 83 are generated.

Next, at t2, when the fourth switching device 80 is turned ON, an output current i2 obtained by combining a discharge current for making the PDP emit light and a current for raising the output voltage of the sustaining circuit from a slightly lower voltage than Vsus (V) to Vsus (V) flow in the fourth switching device 80. Then, the output voltage of the sustaining circuit is pulled up to Vsus (V). At this time, power loss due to an ON resistance is generated in the fourth switching device 80.

Next, at t3, when all of the fourth switching device 80, the first switching device 82, and the second switching device 83 are turned ON together, a Vsus/2 (V) of the capacitor 85 is supplied to a point A via the first and second switching devices 82 and 83. Thus, the voltage at the point A is pull down, so that capacitor components of the inductance 84 and a scan electrode start oscillating. Then, the output voltage of the sustaining circuit falls from Vsus (V) to slightly higher voltage than 0 (V). At this time, the output current i3 flows in the first and the second switching devices 82 and 83. Then, power loss due to respective ON resistances of the first and second switching devices 82 and 83 are generated.

Next, at t4, when the third switching device 81 is turned ON, an output current i4a for pulling down the output voltage of the sustaining circuit from a slightly higher voltage than 0 (V) to 0 (V) flows in the third switching device 81.

Next, at t5, the third switching device 81 is still kept in the ON state, and an output current i5 obtained by combining a discharge current for making the PDP emit light and a current for pulling down the output voltage of the sustaining circuit from a slightly higher voltage than 0 (V) to 0 (V) flows in the third switching device 81.

Next, at t6, the third switching device 81 is still kept in the ON state, and an output current i6 generated due to a fall of the output voltage of the sustaining circuit located in the counterpart side flows in the body diode of the third switching device 81.

The sustaining circuit is operated in the above-described manner, the sustaining circuit can generate a pulse voltage for driving the PDP.

Specifically, with use of the bi-directional device of the present invention including the first and second switching devices 82 and 83 for the sustaining circuit of the PDP circuit, the known sustaining device in which three to five switching devices formed of Si and arranged in parallel can be simplified so as to be able to resist to a pulse-state high current.

Moreover, since the sustaining circuit can be simplified, the driver circuit can be simplified. This is resulted from that the bi-directional device of the present invention has smaller loss than that of a known device, so that heating of the device due to a pulse current is suppressed, and that the bi-directional device is formed of a wide bandgap semiconductor which allows the device to operate even at an increased temperature, so that an equipment for cooling the device or the like is not necessary. Furthermore, it also contributes to simplification of the driver circuit that the switching speed of the bi-directional device of the present invention is faster than that of a known device formed of Si, and switching loss is further reduced.

Note that in the case of a 42 inch diagonal class PDP apparatus, an output voltage of the sustaining circuit is 170 (Vsus) and has a cycle of 5 $\mu$sec. Moreover, each of the pulse-state output currents i1b and i3 is about 50 A.

What is claimed is:

1. A semiconductor device comprising:
   a first transistor including a first substrate formed of a wide bandgap semiconductor and containing an impurity of a first conductive type, a first electrode formed in a principal surface side of the first substrate, a second electrode formed in a back surface side of the first substrate and a first control electrode formed in the principal surface side of the first substrate; and a second transistor formed of a wide bandgap semiconductor, including a second substrate containing an impurity of a first conductive type, a third electrode formed in a principal surface side of the second substrate and electrically connected to the first electrode, a fourth electrode formed in a back surface side of the second substrate, and a second control electrode formed in the principal side of the second substrate, and having the same electric properties as those of the first transistor wherein the first transistor and the second transistor are stacked so that the respective principal surface sides of the first substrate and the second substrate face each other.

2. The semiconductor device of claim 1, which is operable as a bi-directional device, and wherein the first control electrode and the second control electrode are electrodes for controlling a current flowing from the second electrode to the fourth electrode or a current flowing from the fourth electrode to the second electrode.

3. The semiconductor device of claim 1, wherein each of the first transistor and the second transistor is a vertical-type MISFET, wherein each of the first electrode and the third electrode is a source electrode, wherein each of the second electrode and the fourth electrode is a drain electrode, and wherein each of the first control electrode and the second control electrode is a gate electrode.

4. The semiconductor device of claim 1, wherein each of the first substrate and the second substrate is formed of silicon carbide.

5. The semiconductor device of claim 1, further comprising:

a first conductive plate interposed between the first transistor and second transistor, having protruding part, and connected to the first electrode and the third electrode; and a second conductive plate interposed between the first transistor and second transistor, having protruding part, connected to the first control electrode and the second control electrode, and electrically isolated from the first conductive plate.

6. The semiconductor device of claim 1, further comprising:

a first metal plate adhered to the back surface of the first substrate; and a second metal plate adhered to the back surface of the second substrate.

* * * * *